(12) United States Patent
Ryza et al.

(10) Patent No.: US 6,953,654 B2
(45) Date of Patent: Oct. 11, 2005

(54) PROCESS AND APPARATUS FOR REMOVING A CONTAMINANT FROM A SUBSTRATE

(75) Inventors: Nicholas A. Ryza, Austin, TX (US); Allan W. Awtrey, Fort Worth, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/063,049

(22) Filed: Mar. 14, 2002

(65) Prior Publication Data

US 2003/0175626 A1 Sep. 18, 2003

(51) Int. Cl.[7] .................................................. G03F 7/42
(52) U.S. Cl. ....................... 430/322; 430/325; 430/329; 430/331; 134/1
(58) Field of Search ................................ 430/311, 322, 430/325, 331, 329; 134/1, 1.3

(56) References Cited

U.S. PATENT DOCUMENTS

| | | | |
|---|---|---|---|
| 4,944,837 A | 7/1990 | Nishikawa et al. | 156/646 |
| 5,013,366 A | 5/1991 | Jackson et al. | 134/1 |
| 5,068,040 A | 11/1991 | Jackson | 210/748 |
| 5,215,592 A | 6/1993 | Jackson | 134/1 |
| 5,306,350 A | 4/1994 | Hoy et al. | 134/22.34 |
| 5,316,591 A | 5/1994 | Chao et al. | 134/34 |
| 5,377,705 A | 1/1995 | Smith et al. | 134/953 |
| 5,665,527 A | 9/1997 | Allen et al. | 430/325 |
| 5,772,902 A | 6/1998 | Reed et al. | 216/2 |
| 5,783,082 A | 7/1998 | DeSimone et al. | 210/634 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,875,564 A | 3/1999 | Kirkbir et al. | 34/305 |
| 5,908,510 A | 6/1999 | McCullough et al. | 134/2 |
| 5,944,996 A | 8/1999 | DeSimone et al. | 210/634 |
| 5,976,264 A | 11/1999 | McCullough et al. | 134/2 |
| 6,024,801 A | 2/2000 | Wallace et al. | 134/1 |
| 6,033,993 A | 3/2000 | Love, Jr. et al. | 438/745 |
| 6,067,728 A | 5/2000 | Farmer et al. | 34/470 |

(Continued)

FOREIGN PATENT DOCUMENTS

| | | |
|---|---|---|
| EP | 0 397 826 B1 | 12/1992 |
| WO | WO 02/15251 A1 | 8/2000 |
| WO | WO 01/33613 A2 | 5/2001 |

OTHER PUBLICATIONS

King, et al., "The Mutual Solubilities of Water with Supercritical and Liquid Carbon Dioxide", The Journal of Supercritical Fluids, vol. 5, pp. 296–302, May 1992.

Perry, et al., "Chemical Engineers' Handbook", 5th Edition, pp. 21–11 to 21–14 (4 sheets), 1973.

Phase Diagram for $CO_2$ as found at http:www.chem.unc-c.edu/faculty/murphy/1252/chapter11B/sidoo4.htm, Feb. 7, 2002.

(Continued)

Primary Examiner—Kathleen Duda
(74) Attorney, Agent, or Firm—DLA Piper Rudnick Gray Cary US LLP

(57) ABSTRACT

Contaminant removal from a substrate can be performed using a supercritical fluid. An apparatus can be configured to operate at conditions that take advantage of higher solubility of a contaminant in its supercritical state compared to its liquid state. The substrate can be exposed to a supercritical fluid in a chamber to remove at least some of the contaminant. Outside the chamber, the supercritical fluid can be cooled to its corresponding liquid state, in which lower solubility of the contaminant may allow the contaminant to separate into a different phase from the liquid phase of the supercritical fluid. Such contaminant removal can be highly advantageous to substrates that withstand only limited amounts of physical or mechanical stress or heat. The contaminant removal can also be used where geometries virtually prevent removal by physical or mechanical means.

28 Claims, 3 Drawing Sheets

U.S. PATENT DOCUMENTS

| | | | |
|---|---|---|---|
| 6,140,243 | A | 10/2000 | Wallace et al. ............. 438/700 |
| 6,149,828 | A | 11/2000 | Vaartstra ...................... 216/57 |
| 6,200,637 | B1 | 3/2001 | McClain et al. ............ 427/336 |
| 6,224,774 | B1 | 5/2001 | DeSimone et al. ......... 210/634 |
| 6,225,995 | B1 | 5/2001 | Jacobs et al. ............... 345/335 |
| 6,277,753 | B1 | 8/2001 | Mullee et al. ............. 438/692 |
| 6,286,231 | B1 | 9/2001 | Bergman et al. .............. 34/410 |
| 6,306,564 | B1 | 10/2001 | Mullee ....................... 430/329 |
| 6,331,487 | B2 | 12/2001 | Koch .......................... 438/692 |
| 2001/0008800 | A1 | 7/2001 | Koch |

OTHER PUBLICATIONS

Bruan, et al., "Photostrip faces 300 mm, copper and low–k convergence," 7 pages, Semiconductor International, Sep. 2000.

Sundararajan, et al., "Block copolymers as supercritical $CO_2$ developable photoresists" Department of Materials Science and Engineering, pp. 130–131.

Rubin, et al., "A Comparison of Chilled DI Water/Ozone and $CO_2$–Based Supercritical Fluids as Replacements for Photoresist–Stripping Solvents," International Electronics Manufacturing Technology Symposium, pp. 308–314, Jan. 1998.

Gabor, et al., "Block and Random Copolymer Resist Designed for 193 nm Lithography and Environmentally Friendly Supercritical $CO_2$ Development," SPIE vol. 2724, pp. 410–417, Jun. 1996.

Wetmore, et al., "Supercritical Fluid Processing: A New Dry Technique for Photoresist Developing," SPIE vol. 2438, pp. 694–703, Jun. 1995.

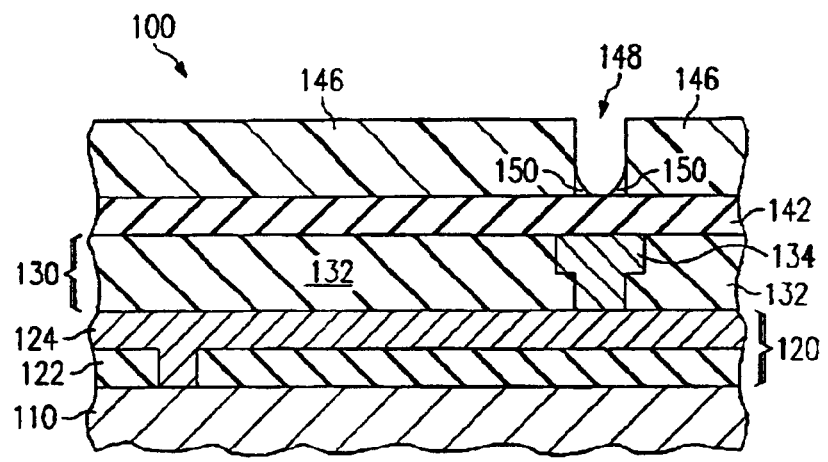
FIG. 1
*(PRIOR ART)*
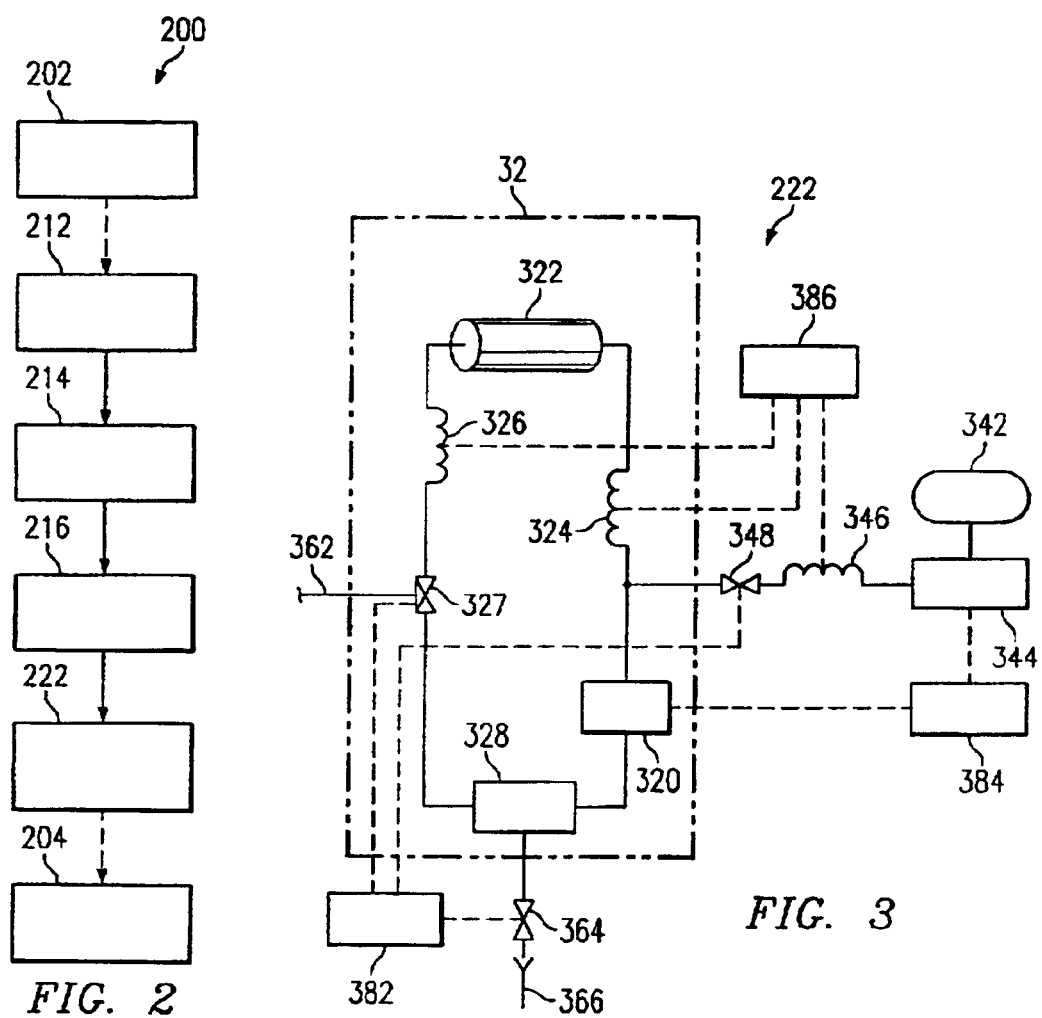
FIG. 2
FIG. 3

PROCESS AND APPARATUS FOR REMOVING A CONTAMINANT FROM A SUBSTRATE

BACKGROUND OF INVENTION

1. Field of the Invention

This invention relates in general to processes and apparatuses for removing contaminants, and more particularly, to those processes and apparatuses for removing contaminants from substrates using supercritical fluids

2. Description of the Related Art

Miniaturization of microelectronic circuits allows more circuitry to be incorporated within an individual integrated circuit. The increased density is possible due to the reduction in size of geometries of components within those integrated circuits. Other microscopic components, such as a micromechanical electrical switch (MEMS), micro-optical switches, and the like, are also being reduced in size. However, the reduction in size is not without its problems.

FIG. 1 includes a prior art illustration of a cross-sectional view of a portion of a semiconductor device substrate 100. The semiconductor device substrate 100 includes an interconnect layer 110, a second interconnect level 120, a third interconnect level 130, an insulating layer 142, and a patterned resist layer 146. The second interconnect level 120 includes a patterned insulating layer 122 and a dual inlaid interconnect 124, and the third interconnect level 130 includes a patterned insulating layer 132 and a dual inlaid interconnect 134. Each of the insulating layers 122, 132, and 142 may include one or more insulating films. Likewise, each of the interconnects 124 and 134 may include more than one film.

Although not shown, the interconnect layer 142 is significantly thicker in portions not shown in FIG. 1. Prior to forming the patterned resist layer 146, the insulating layer 142 has been patterned a first-time to form interconnect trenches within the insulating layer 142. When forming the resist layer 146 over the patterned insulating layer 142, the thickness of the resist layer 146 can be relatively thick within the trenches previously formed, such as that shown in FIG. 1. The thickness of the patterned resist layer 146 within that trench can exceed more than approximately two microns.

An opening 148 is defined by the patterned resist layer 146 and may be formed using conventional photolithographic techniques. The opening 148 may have a dimension of approximately 0.4 microns and would generally correspond to a minimum geometry for a via portion of a dual-inlaid interconnect. The aspect ratio of the opening 148 may exceed 5:1. When developing and rinsing the resist layer 146, contaminants 150 (e.g., water) may remain near the bottom of the opening 148. Removing the contaminants 150 generally is very difficult as many organic solvents (e.g., ketones) that could remove the contaminants 150 may erode or dissolve the patterned resist layer 146, thereby, distorting the image patterned. The contaminants 150 need to be removed without significantly changing the shape of the patterned resist layer 146 or otherwise significantly adversely affecting the underlying portions of the substrate.

In one attempt to remove a contaminant from a substrate, a dense phase gas can be used to help remove contaminants from a substrate. For example, a dense phase gas, such as carbon dioxide ($CO_2$) may be used to remove photoresist from the substrate. In FIG. 1, the resist layer 146 is not to be removed or otherwise significantly altered in its shape. The attempt also addresses the desirability of adding water to the dense phase gas. In FIG. 1, water is to be removed from, and not added to, the substrate. Therefore, adding water to the dense phase gas may be counterproductive to removing water from the substrate.

An apparatus may be used with a supercritical fluid. The apparatus is configured to flow a fluid from a pressure vessel, through a cold trap, and then to a heat exchanger before reaching a pump. Such a configuration may not operate optimally because contaminants may not be removed very quickly because the fluid changes from a supercritical fluid to a liquid in the heat exchanger, which is downstream from the cold trap.

SUMMARY OF INVENTION

Contaminant removal from a substrate can be performed using a supercritical fluid. An apparatus can be configured to operate at conditions that take advantage of higher solubility of a contaminant in its supercritical state compared to its liquid state.

In one set of embodiments, a process for removing a contaminant from a substrate can comprise placing the substrate within a chamber. The substrate can include a pseudoplastic material and the contaminant. The process can also comprise exposing the pseudoplastic material to a supercritical fluid to remove at least part of the contaminant from the substrate. The process can further comprise removing the substrate from the chamber after exposing the pseudoplastic material to the supercritical fluid. After removing the substrate, the shape of the pseudoplastic material is not significantly changed when compared to the shape of the pseudoplastic material before placing the substrate within the chamber.

In another set of embodiments, a process for removing a contaminant from a substrate can comprise placing the substrate within a chamber. The substrate includes the contaminant, and the contaminant includes molecules having a dipole moment of at least approximately one. The process can further comprise exposing the substrate to a supercritical fluid to remove at least part of the contaminant from the substrate. The supercritical fluid can comprise molecules with a dipole moment less than approximately one. The process can still further comprise removing the substrate from the chamber after exposing the substrate to the supercritical fluid.

In still another set of embodiments, an apparatus for removing a contaminant from a substrate using a supercritical fluid can comprise a chamber, a temperature modulator, a separating portion, a recirculating pump, and tubing. The chamber may be adapted to receive the substrate and configured to withstand the pressure of the supercritical fluid. The temperature modulator can be adapted to cool the supercritical fluid to a liquid. The separating portion may be adapted to aid in separating the contaminant from the liquid. The temperature modulator may lie between the chamber and the separating portion.

The foregoing general description and the following detailed description are exemplary and explanatory only and are not restrictive of the invention, as defined in the appended claims.

BRIEF DESCRIPTION OF DRAWINGS

The present invention is illustrated by way of example and not limitation in the accompanying figures.

FIG. 1 includes a prior art illustration of a cross-section view of a portion of a substrate comprising a patterned resist layer with an opening having water near the bottom of the opening.

FIG. 2 includes a flow diagram illustrating a lithographic system for forming a patterned layer and removing a contaminant from that the patterned layer.

FIG. 3 includes a schematic diagram of a contaminant remover having a closed-loop section that recirculates a fluid for removing a contaminant from a substrate.

Figure 4:
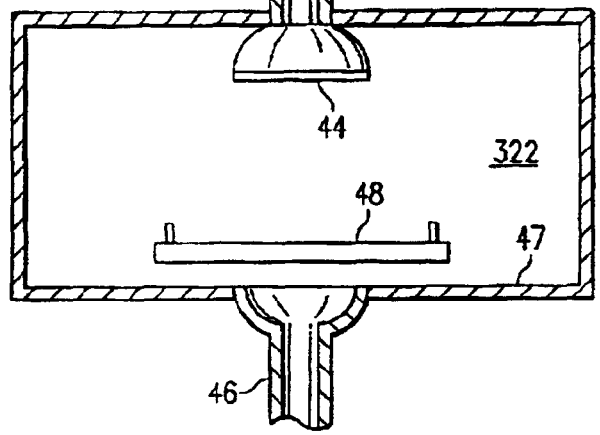
FIG. 4 includes an illustration of a cross-sectional view of a chamber used with the apparatus of FIG. 3.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION

Reference is now made in detail to the exemplary embodiments of the invention, examples of which are illustrated in the accompanying drawings. Wherever possible, the same reference numbers will be used throughout the drawings to refer to the same or like parts (elements).

Contaminant removal from a substrate can be performed using a supercritical fluid. An apparatus can be configured to operate at conditions that take advantage of higher solubility of a contaminant in its supercritical state compared to its liquid state. The substrate can be exposed to a supercritical fluid in a chamber to remove at least some of the contaminant. Outside the chamber, the supercritical fluid can be cooled to its corresponding liquid state, in which lower solubility of the contaminant may allow the contaminant to separate into a different phase from the liquid phase of the supercritical fluid. Such contaminant removal can be highly advantageous to substrates that withstand only limited amounts of physical or mechanical stress or heat. The contaminant removal can also be used where geometries virtually prevent removal by physical or mechanical means.

FIG. 2 includes a lithographic system 200 that can be used in processing a substrate including a patterned layer including removing a contaminant, such as water or the like, from a substrate. System 200 is merely illustrative of just one embodiment. After reading the specification, one of ordinary skill in the art will appreciate that many other systems could be used.

A cassette 202 or other substrate carrier can provide input to a coater 212. The cassette 202 may be manually or automatically coupled to the coater 212. Coater 212 can apply a film across the surface of a base material of the substrate. The film can include resist, such as resist, ultraviolet resist, electron resist, x-ray resist, or the like; imageable polyimide; or the like. After coating substrates within the coater 212, the substrates can be moved to a printer 214. The printer can include virtually any lithographic tool including a stepper tool, an excimer laser lithographic tool, an x-ray lithographic tool, extreme ultraviolet radiation lithographic tool, scattering with aperture limited projection lithography ("SCALPEL") tool, or the like. The printer 214 selectively exposes the film that was applied by the coater 212.

After printing, the substrates can be processed within a developer 216. The developer may expose the substrate to a developing fluid appropriate for removing exposed or unexposed portions of the selectively exposed film to form a substrate with a patterned layer. If a positive-acting resist or other similar material was used, the exposed portions may be washed away by the developing fluid. If a negative-acting resist or other similar material was used, the unexposed portions may be washed away by the developing fluid. After developing, a subsequent rinsing fluid may be used to remove the developing fluid from the substrate. Most of the rinsing fluid is removed by spinning the substrate. The rinsing and spinning may be performed within the developer 216.

Some of the rinsing fluid, which can be a contaminant and include water, may reside near the bottom of openings within the patterned layer even after spinning. The patterned layer is typically a pseudoplastic material and may be able to withstand limited physical or mechanical stress without significantly and adversely changing the shape of the patterned layer. A contaminant remover 222 can be used in removing the contaminant from the substrate without significantly adversely affecting the image. The contaminant remover 222 is explained in more detail in FIG. 3. The contaminant remover 222 is coupled to the developer 216. After contaminant removal, the substrates may be moved to an output cassette 204 upon completion. The cassette 204 may be manually or automatically decoupled from the supercritical cleaner 222 upon completion of the processed sequence. Cassettes 202 and 204 may be the same or different cassettes.

System 200, as illustrated in FIG. 2, may include automated equipment that allows all the pieces of equipment, as shown connected by arrows with solid lines, to be performed automatically without any human intervention or intermediate storage areas. Other pieces of equipment, as shown connected by arrows with dashes lines, may not be a substantially permanent part of the integrated equipment 212, 214, 216, and 222. As illustrated in FIG. 2, no other processing equipment lies between the components shown. Only substrate transport equipment (e.g., wafer tracks) may lie between the components in FIG. 2. For the purposes of this specification, the substrate transport equipment is not considered processing equipment since it does not significantly change the physical or chemical properties of the substrates, including any of their layers or films. FIG. 3 includes a schematic drawing of the contaminant remover 222 as first introduced with respect to FIG. 2. The contaminant remover 222 can be an apparatus having a portion that includes a closed-loop section 32. The closed-loop section can comprise a chamber 322, at least one temperature modulator, such as heat exchangers 324 and 326, a three-way valve 327, a separator 328, a recirculating pump 320, and tubing between these various components within the closed-loop section 32. During operation, a substrate lies within the chamber. Details of the chamber are given in FIG. 4.

The closed-loop section 32 may operate at a variety of temperatures. The chamber 322 must be able to at least reach a critical temperature of a supercritical fluid that could be used within the chamber 322. If carbon dioxide is used as a supercritical fluid, its critical temperature is approximately 31 degrees Celsius. If a different molecular compound is used, the critical temperature may change, and therefore, the minimum operating temperature for the chamber 322 may also change.

The upper limit on the temperature can be a temperature that the substrate may be able to withstand without significantly adversely affecting any portion of the substrate including the patterned layer. For example, many resists may be able to withstand a temperature as high as 250 degrees Celsius. At higher temperatures, the resist may reticulate, decompose, or otherwise undergo a chemical reaction. Polyimide may be able to withstand higher temperatures compared to resists. For a dielectric layer, such as a spin-on dielectric, the temperature may be even higher than polyimide, such as 450 degrees Celsius. Therefore, a minimum temperature within the chamber should be approximately the critical temperature of the supercritical fluid and a maximum temperature should not exceed a temperature that could significantly adversely affect to the substrate.

The temperature can be controlled in part using temperature modulator(s) that can include virtually any type of heating means or cooling means. In FIG. 3, heat exchangers 324 and 326 are examples of these cooling means and heating means. The heat exchangers may include coaxial tubing and use a fluid to heat or cool the fluid going to or coming from the chamber 322. Alternatively, the heat exchangers can include tubing within a substantially constant temperature bath. The heating or cooling fluid (used to heat or cool, respectively, the fluid going to or coming from the chamber 322) may include a liquified gas (nitrogen, oxygen, argon, or the like), chilled or heated liquids (water, ethylene glycol, or the like), or utilize heating or cooling from gas compression or expansion or liquid-gas phase changes (typically using a freon or other halogenated hydrocarbon, ammonia, or the like).

Temperature modulation can be performed by other types of heat transfer apparatuses. Heating tape, flame or other combustion or its gas products, radiation (e.g., tungsten lamp, infrared heater, or the like) may be used for heating. Cooling can be achieved by spraying the outside of the tubing with a chilled liquid, such as water. After reading this specification, skilled artisans appreciate that many types of heating or cooling means in this and the prior paragraph, and potentially others, could be used to modulate a temperature within the closed-loop section 32. More information regarding the temperatures during operation is discussed later in this specification.

The design of the contaminant remover 222 needs to withstand pressures of a supercritical fluid. Therefore, the chamber 322, fittings, tubing and other portions of the contaminant remover 222 should be able to withstand at least the critical pressure for the supercritical fluid. For carbon dioxide, this is at least approximately 7.39 Although no known theoretical maximum pressure is known, the higher the pressure, the more costly or complicated the apparatus will be. In many instances, the contaminant remover 222 may be designed to handle a pressure no greater than approximately 34.5 MPa or 5000 psig. More information regarding the pressures during operation is discussed later in this specification.

At least a portion of the separator 328 typically lies at an elevation lower than adjacent portions of the system 222. Therefore, the three-way valve 327, the recirculating pump 320, and tubing between the separator 328 and each of the valve 327 and pump 320 may lie at elevations at least partially higher than a portion of the separator 328. In one specific embodiment, at least part of the separator 328 lies at an elevation lower than any of the other part of the closed-loop section 32. In one specific embodiment, only the drain valve 364, the drain 366, and associated plumbing may lie at elevations lower than the lowest point of the separator 328. The operation of the separator 328 is described in more detail later.

System 222 further comprises a feed section including a source 342; a pressurizing pump 344, such as a compressor, blower, a combination thereof, or the like; a temperature modulator 346 similar to those previously described with respect to the closed-loop section 32, and a valve 348. Tubing lies between each of these components and also couples the feed system with the open loop section 32. Although not shown, a gas feed bypass, including its associated valves and tubing, around the pressuring pump 344 may be used to allow the gas to be introduced into the chamber 322 during a purging cycle, if desired.

System 222 can further comprises an exhaust 362 that may be plumbed to a scrubber (not shown), a drain valve 364 that allows the separator to be drained to a drain 366, a valve controller 382, a pump controller 384, and a temperature controller 386. Although not shown, several pressure and temperature sensors may be located at different points throughout the system to measure or monitor the temperature and pressure of the system.

The controllers 382, 384, and 386 may be operated independently, connected to one another, replaced by fewer or more controllers as desired by a user of the system, or coupled to a computer (not shown) to centrally control the contaminant remover 222. Signals from the temperature and pressure sensors can be sent to and received by any one or more of the controllers. Dashed lines between the controllers and various parts of the system 222 illustrate control signals that can be sent to various parts the system. The signals may include electronic, radio frequency, optic, pneumatic, mechanical, or any other signals used for controlling the operation of the system 222.

FIG. 4 includes a cutaway illustration of a portion of the chamber 322 and is connected to inlet tubing 42 and outlet tubing 46. The inlet tubing 42 is connected to a showerhead 44 within the chamber 322. The showerhead 42 may be replaced by a sparger, and baffle plates or other flow distributors may be used to control the flow of a fluid within the chamber 322. A substrate holder 48 lies above a bottom wall 47 of the chamber 322. In an alternative embodiment, the bottom wall may be sloped to allow denser materials (e.g., water) to flow into the outlet tubing 46. The chamber 322 may include other features that are not shown, such as a door or other port for inserting or removing a substrate, temperature and pressure sensors, optical view port for contamination monitoring, and the like. The volume of the chamber 322 is in a range of approximately 50–500 milliliters, and the volume of the closed-loop section 32 is in a range of approximately 0.5–3.0 liters. Although a single substrate chamber is shown, modifications can be made to allow batch processing to potentially reduce the average processing time per substrate for contamination removal. The volume of the chamber 322 and closed-loop section 32 is a function of the number of substrates that the chamber 322 can holder. A larger number of substrates may require a larger volume.

Figure 5:
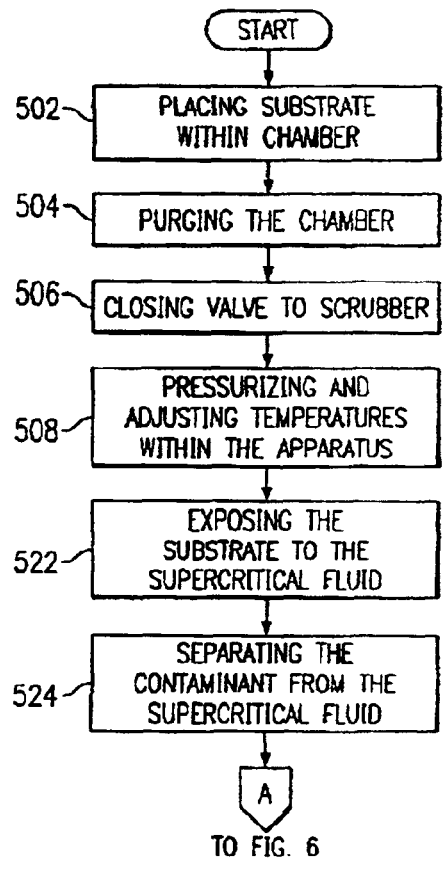
FIGS. 5 and 6 include a process flow diagram of acts that can be performed to remove a contaminant from a substrate using the apparatus of FIG. 3.
Figure 6:
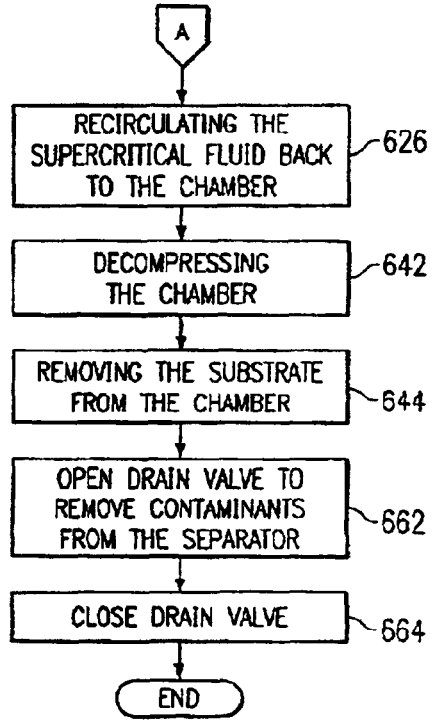

Attention is now directed to FIGS. 5 and 6 with respect to a process flow diagram for using the system 222 to remove a contaminant from a substrate. Cross references to FIG. 3 will be used to illustrate how the process relates to the equipment. The process can comprise placing a substrate within the chamber 322 in FIG. 3 (block 502 in FIG. 5). A door or other port (not shown) of chamber 322 may be opened and inserted into the chamber 322. Alignment of the substrate within the chamber may be performed, if needed or desired. The door or other port may be closed.

After the substrate has been placed within chamber 322, the process can continue with purging the chamber 322 (block 504 in FIG. 5). Referring to FIG. 3, during this purging cycle, drain valve 364 is closed, if this has not already occurred, and valve 348 is opened to allow gas(es) from the source 342 to enter and flow through at least a portion of the section 32 and chamber 322. During the purging act, the purging gas can be directed to the exhaust 362 (and eventually to the scrubber) using the three-way valve 327. The purging can help to remove the contaminants in the system to reduce the amount of water or oxygen within the chamber 322. Gases that may be used include noble gases (helium, argon, xenon, or the like) or relatively inert gases (such as molecular nitrogen, carbon dioxide, or the like). In this particular example, carbon dioxide can be used as the purging gas and as a principal compound of the supercritical fluid. As used in this specification, a compound can be an element or a molecule.

Alternatively, at least a portion of the section 32 or chamber 322 could be connected to a vacuum system (not shown) to reduce the pressure, and thereby, to reduce the level of potentially contaminating gases within the chamber 322. If the substrate includes a layer with a relatively volatile component dissolved within the layer, evacuation may not be a good choice as this may allow outgassing or bubbling of that layer and could distort its shape, which is undesired.

After purging, the process can also includes closing the valve to the scrubber (block 506 in FIG. 5). In this particular embodiment as shown in FIG. 3, the three-way valve 327 can be redirected to allow fluid to flow from the chamber 322 to the separator 328, as opposed to the scrubber 362.

The process can further include pressurizing and adjusting temperatures within the apparatus (block 508 in FIG. 5). During this act, the various controllers 382, 384, and 386 can be activated to allow for the proper pressures and temperatures to be reached. For example, pump controller 384 may send a signal to the pressurizing pump 344 to increase the pressure within the section 32. Depending on the species selected for the supercritical fluid, the pressure and temperature in at least one portion of the closed-loop section 32 is design to allow operation of a reactor 322 at least at the critical temperature and critical pressure for that compound. For example, if carbon dioxide is used, the temperature of the reactor is typically at least 31 degrees Celsius and pressure is at approximately 5.78 MPa or 1070 psig. No theoretical upper and lower limits are know for the flow rate, other than it needs to be greater than zero.

In one particular embodiment, the pressure within the chamber 322 can be in a range of approximately 10.3–20.7 MPa or 1500–3000 psig, and the temperature within the chamber 322 can be in a range of approximately 31–50 degrees Celsius. The flow rate for the closed-loop section 32 can be in a range of approximately 0.5–25.0 liters per minute, and more typically will be in a range of approximately 1.0–5.0 liters per minute.

While in the chamber, the solubility of water and potentially other contaminants within the supercritical carbon dioxide is typically higher than carbon dioxide when it is in its liquid phase. The temperature difference allows contaminants to be dissolved within the supercritical fluid when in the chamber 322. After leaving chamber 322, fluid is cooled to a temperature in a range or approximately 10 to 30 degrees Celsius. During this cooling, the supercritical carbon dioxide becomes liquid carbon dioxide. The cooling also decreases the amount of water that can be dissolved within the carbon dioxide. Therefore, the relatively denser water can separate from the liquid carbon dioxide and be collected within separator 328. The liquid can then pass through the recirculating pump 320 and then proceed back to the heat exchanger 324.

During this sequence, the process can include exposing the substrate to the supercritical fluid (block 522 in FIG. 5), separating the contaminant from the fluid (block 524 in FIG. 5), and recirculating the supercritical fluid back to the chamber (block 626 in FIG. 6). These three acts may be performed simultaneously during at least one point of in time during a steady state portion of the process. Note that the carbon dioxide is in its supercritical state when it is within the chamber 322, and in its liquid state when present within the separator 328 and recirculating pump 328. The operation of the closed-loop section 32 is design to be substantially isobaric. However, flowing the supercritical fluid and liquid carbon dioxide through the closed-loop section 32 can cause some pressure loss to occur. In order to keep the section 32 substantially isobaric, a relatively small amount of fluid may be introduced into the closed-loop section 32 by adjusting valve 348 or a flow controller (not shown) in the feed section.

Figure 7:
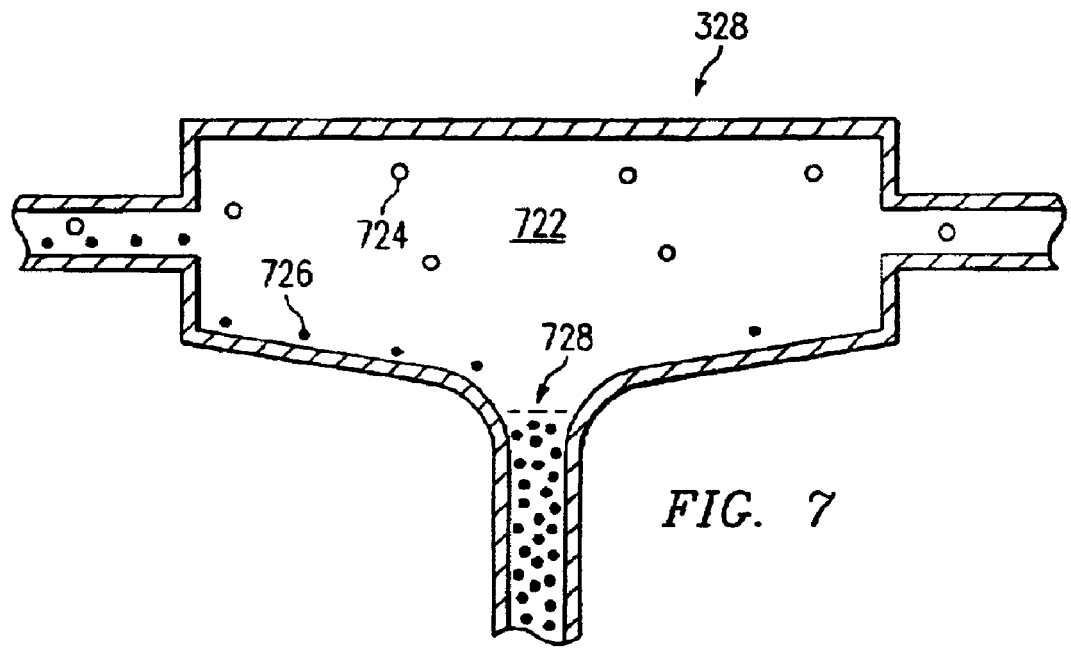
FIG. 7 includes an illustration of a cross-sectional view of a portion of the separator during operation of the apparatus in FIG. 3.

FIG. 7 includes a cross-sectional view of a portion of the separator 328 during operation. Water is less soluble in liquid carbon dioxide compared to supercritical carbon dioxide. Also, water is denser than liquid carbon dioxide. Water from the substrates can diffuse or dissolve into the supercritical carbon dioxide and, after cooling, at least partially be separated from the liquid carbon oxide and collect in the separator 328 before the carbon dioxide is recirculated back to the chamber 322.

In FIG. 7, separator 328 includes liquid carbon dioxide 722, dissolved water 724, and water droplets 726. The water droplets 726 can coalesce and form an interface 728. The flow of the liquid carbon dioxide through at least part of the separator is not turbulent to allow better separation of the water from the liquid carbon oxide.

The volume of the separator 328 may be selected to allow sufficient residence time for the water and liquid carbon dioxide to separate. The volume should not be so small that water droplets 726 enter the recirculating pump, although some dissolved water 724 can be recirculated. Although no known theoretical upper limit on the volume is known for the separator 328, practical limitations, such as cost and size (available space) may provide a limit. As an example, the separator 328 may have a volume in a range of approximately 1–10 liters. In addition to the cone-bottom separator 328, other settlers or decanters may be used and can include simple horizontal decanters, vertical decanters, sloped settlers, centrifuges, or the like.

The process can continue for a set time, until an endpoint is detected, or a combination thereof. If endpoint detection is used, the amount of water or other contaminants being collected can be determined by a level sensor within or coupled to separator 328 or may be included as a measurement of the water content within chamber 322, separator 328, or any of the associated tubing between those two points (e.g., in-line measurement). In one specific example, a radiation source may irradiate a portion of the fluid passing through a piece of tubing to determine the concentration of water or other contaminants within that section.

When most of the water or other contaminants have been removed from the substrate, the rate of contaminant collection may be relatively constant and close to zero. Therefore, a plot of water concentration versus time may indicate an exponential decay in the concentration of water within the closed-loop section 32. After the change in concentration relative to a change of time is below a predetermined amount (rate of change close to zero), the endpoint may be determined to occur. At this point, the substrate exposure to the supercritical fluid may be terminated. Alternatively, after endpoint detection, a set amount of time may pass before the exposure is terminated.

In still another embodiment, a set time without any endpoint detection may be used. The time for exposure will depend on a number of factors including the number of substrates with in the chamber 322, the aspect ratios of the openings, the volume of the chamber 322, the volume all of contaminants present within the pattern layer on the substrates, and diffusivity of the contaminant within the supercritical fluid. Typically, the time will be any range of approximately 0.1–5.0 minutes per substrate on average.

The process can continue with decompressing the chamber (block 642 in FIG. 6). Referring to FIG. 3, the decompression can be achieved by redirecting the three-way valve 327 to the exhaust 362. Although not shown, a gas flow meter, regulator, metering valve, or the like within exhaust 362 may be used to control the rate of decompression within the chamber. The rate of decompression should not be so high that solid carbon dioxide can form or allow water (or other contaminants) to become a separate phase in the chamber 322 and redeposit on the substrate. The time for decompression can be a function of the volume of the closed-loop section 32. For many systems, the time period for decompressing should be in a range of approximately 0.5–2.0 minutes for a carbon dioxide supercritical fluid system. After decompression, the substrate can be removed from the chamber (block 644).

Figure 8:
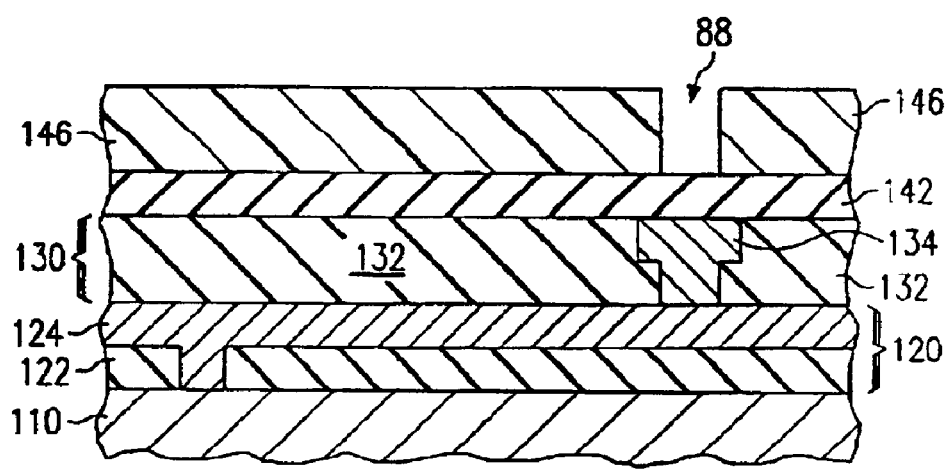
FIG. 8 includes an illustration of a cross-section view of the substrate of FIG. 1 after using the apparatus of FIG. 3 to remove water from the bottom of an opening.

FIG. 8 includes an illustration of a cross-sectional view of a portion of the semiconductor device substrate after removing water and potentially other contaminants from the bottom of a pattern opening. Note in FIG. 8, the aspect ratio (depth:width) of the openings typically can be at least 2:1 and may exceed 10:1. The process using the supercritical fluid is capable of removing the contaminants without significantly affecting the shape of the pattern layer that is part of the substrate. The patterned layer can have substantially the same shape before and after being processed in the contaminant remover 222. Further, the supercritical fluid typically does not significantly erode or remove too much of the pattern layer. Additionally, the process can be configured to allow the supercritical fluid to become a gas and allows for relatively easy removal of chemicals from the chamber.

The process can further comprise opening the drain valve 364 to remove contaminants from the separator 328 (block 662 in FIG. 6). The water and other potential contaminants can then flow into the drain 366. Should some pressure be required, the closed-loop section 32 may be slightly pressurized (higher than atmospheric pressure) to allow gas to flow through the separator 328 and the drain valve 364 to the drain 366. After the draining sequence is completed, the process can continue with closing the drain valve 364 (block 664). At this point in time, one cycle of contaminant removal has occurred and the process can either be terminated or restarted by placing another substrate within chamber as illustrated in block 502 in continuing with the process previously described.

Although much of the focus has been placed on carbon dioxide, other fluids may be used for a supercritical cleaning process. For example carbon dioxide maybe replaced by sulfur hexafluoride or potentially other molecules that can achieve supercritical state within the temperature restraints imposed by the substrate. In addition to decafluoro-diethyl ether, other types of fluorinated organic compounds can be used in a supercritical fluid to help remove water or other contaminants from the substrates. Additionally, still other chemicals may be added to the carbon dioxide, sulfur hexafluoride, or other supercritical fluid to help in the removal of water or other contaminants. Note that a combination of carbon dioxide and decafluoro-diethyl ether can remove water even though the dipole moments of carbon dioxide and decafluoro-diethyl ether are less than one and may be approximately zero.

Virtually any type of substrate may be used with the system. Substrates may include semiconductor device substrates, partially or completely formed micro-electrical mechanical or micro-optical components, or other substrates including a feature designed at 100 micron and lower design rules. Semiconductor device substrates can include monocrystalline silicon, germanium, silicon carbide, silicon germanium, III-V, and II-VI base materials. Alternatively, the semiconductor devices substrates can include silicon-on-insulator, silicon-on-sapphire, or the like. Further, electronic components, insulating layers, and contact and interconnect structures may be part of the semiconductor device substrates.

Although the contaminant remover 222 has been disclosed as part of an integrated lithographic system, the contaminant remover 222 can be operated as a stand-alone unit or as part of a process sequence after etching or depositing a film. For example, water or other contaminants may need to be removed from a chemically or physically vapor deposited film having a cusp, reentrant angle, or other feature making contamination removal by mechanical means (e.g., spin drying) virtually impossible. In such an instance, the contamination remover 222 may be used to remove residual liquids from a hard-to-reach area of the substrate.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms comprises, comprising, "includes," "including," "has," "having" or any other variation thereof, are intended to cover a non-exclusive inclusion. For example, a process, process, article, or apparatus that comprises a list of elements is not necessarily limited only those elements but may include other elements not expressly listed or inherent to such process, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

What is claimed is:

1. A process for removing a contaminant from a substrate comprising:
    placing the substrate within a chamber, wherein the substrate includes a pseudoplastic material and the contaminant;
    exposing the pseudoplastic material to a supercritical fluid to remove at least part of the contaminant from the substrate;
    flowing the supercritical fluid to a separator that lies at an elevation lower than the chamber;
    separating at least a portion of the contaminant from a compound within the supercritical fluid; and
    removing the substrate from the chamber after exposing,
    wherein a shape of the pseudoplastic material, after removing, is not significantly changed when compared to the shape of the pseudoplastic material, before placing.

2. The process of claim 1, wherein:
    the supercritical fluid comprises molecules with a dipole moment less than approximately one; and
    the contaminant includes water.

3. The process of claim 1, further comprising purging the chamber with a gas before exposing, wherein the gas and the supercritical fluid comprise a same molecular compound.

4. The process of claim 1, wherein:
    exposing is performed at an exposure temperature of at least a critical temperature of the supercritical fluid; and
    separating is performed at a separation temperature below the critical temperature of the supercritical fluid.

5. The process of claim 1, further comprising decompressing the chamber after exposing, wherein decompressing is performed while the substrate lies within the chamber and at a rate such that the supercritical fluid does not form a liquid or a solid.

6. The process of claim 1, wherein:
    the pseudoplastic material is at least part of a patterned organic layer defining an opening; and
    the opening has an aspect ratio of at least approximately 2:1.

7. The process of claim 1, wherein exposing is performed at least until an endpoint is detected.

8. A process for removing a contaminant from a substrate comprising:
    placing the substrate within a chamber, wherein:
        the contaminant overlies the substrate; and
        the contaminant includes molecules having a dipole moment of at least approximately one;
    exposing the substrate to a supercritical fluid to remove at least part of the contaminant from the substrate, wherein the supercritical fluid comprises molecules with a dipole moment less than approximately one;
    flowing the supercritical fluid to a separator that lies at an elevation lower than the chamber;
    separating at least a portion of the contaminant from a compound within the supercritical fluid; and
    removing the substrate from the chamber after exposing.

9. The process of claim 8, wherein:
    the substrate comprises a patterned layer defining an opening;
    the opening has an aspect ratio of at least approximately 2:1; and
    at least part of the contaminant lies near a bottom of the opening.

10. The process of claim 8, further comprising purging the chamber with a gas before exposing, wherein the gas and the supercritical fluid comprise a same molecular compound.

11. The process of claim 8, wherein:
    exposing is performed at an exposure temperature of at least a critical temperature of the supercritical fluid; and
    separating is performed at a separation temperature below the critical temperature of the supercritical fluid.

12. The process of claim 8, further comprising decompressing the chamber after exposing, wherein decompressing is performed while the substrate lies within the chamber and at a rate such that the supercritical fluid does not form a liquid or a solid.

13. The process of claim 8, wherein exposing is performed at least until an endpoint is detected.

14. A process for removing a contaminant from a substrate comprising:
    placing the substrate within a chamber, wherein the substrate includes a pseudoplastic material and the contaminant;
    exposing the pseudoplastic material to a supercritical fluid to remove at least part of the contaminant from the substrate;
    cooling the supercritical fluid to form a liquid, wherein cooling is performed on the supercritical fluid after it has been exposed to the pseudoplastic material;
    pumping the liquid;
    heating the liquid to form the supercritical fluid, wherein heating is performed on the liquid after it has been pumped; and
    removing the substrate from the chamber after exposing,
    wherein a shape of the pseudoplastic material, after removing, is not significantly changed when compared to the shape of the pseudoplastic material, before placing.

15. The process of claim 14, wherein:
    the supercritical fluid comprises molecules with a dipole moment less than approximately one; and
    the contaminant includes water.

16. The process of claim 14, further comprising purging the chamber with a gas before exposing, wherein the gas and the supercritical fluid comprise a same molecular compound.

17. The process of claim 14, further comprising:
    flowing the supercritical fluid to a separator that lies at an elevation lower than the chamber; and
    separating at least a portion of the contaminant from a compound within the supercritical fluid.

18. The process of claim 17, wherein:
    exposing is performed at an exposure temperature of at least a critical temperature of the supercritical fluid; and
    separating is performed at a separation temperature below the critical temperature of the supercritical fluid.

19. The process of claim 14, further comprising decompressing the chamber after exposing, wherein decompressing is performed while the substrate lies within the chamber and at a rate such that the supercritical fluid does not form a liquid or a solid.

20. The process of claim 14, wherein:

the pseudoplastic material is at least part of a patterned organic layer defining an opening; and the opening has an aspect ratio of at least approximately 2:1.

21. The process of claim 14, wherein exposing is performed at least until an endpoint is detected.

22. A process for removing a contaminant from a substrate comprising:

placing the substrate within a chamber, wherein:
the contaminant overlies the substrate; and
the contaminant includes molecules having a dipole moment of at least approximately one;

exposing the substrate to a supercritical fluid to remove at least part of the contaminant from the substrate, wherein the supercritical fluid comprises molecules with a dipole moment less than approximately one;

cooling the supercritical fluid to form a liquid, wherein cooling is performed on the supercritical fluid after it has been exposed to the pseudoplastic material;

pumping the liquid;

heating the liquid to form the supercritical fluid, wherein heating is performed on the liquid after it has been pumped; and removing the substrate from the chamber after exposing.

23. The process of claim 22, wherein:

the resist is at least part of a patterned layer defining an opening;

the opening has an aspect ratio of at least approximately 2:1; and at least part of the contaminant lies near a bottom of the opening.

24. The process of claim 22, further comprising purging the chamber with a gas before exposing, wherein the gas and the supercritical fluid comprise a same molecular compound.

25. The process of claim 22, further comprising:

flowing the supercritical fluid to a separator that lies at an elevation lower than the chamber; and separating at least a portion of the contaminant from a compound within the supercritical fluid.

26. The process of claim 25, wherein:

exposing is performed at an exposure temperature of at least a critical temperature of the supercritical fluid; and separating is performed at a separation temperature below the critical temperature of the supercritical fluid.

27. The process of claim 22, further comprising decompressing the chamber after exposing, wherein decompressing is performed while the substrate lies within the chamber and at a rate such that the supercritical fluid does not form a liquid or a solid.

28. The process of claim 22, wherein exposing is performed at least until an endpoint is detected.

* * * * *